(12) United States Patent
Chang et al.

(10) Patent No.: US 11,357,112 B2
(45) Date of Patent: Jun. 7, 2022

(54) MOLDED INTERCONNECT DEVICE

(71) Applicant: Molex, LLC, Lisle, IL (US)

(72) Inventors: Tsuey Choo Chang, Lisle, IL (US); Steven Zeilinger, Carol Stream, IL (US); Hyun-Jong Ko, Seoul (KR); Patrick Riley, LaGrange, IL (US); SukMin Kang, Gwangmyeong (KR)

(73) Assignee: Molex, LLC, Lisle, IL (US)

( * ) Notice: Subject to any disclaimer, the term of this patent is extended or adjusted under 35 U.S.C. 154(b) by 367 days.

(21) Appl. No.: 16/315,244

(22) PCT Filed: Jul. 5, 2017

(86) PCT No.: PCT/US2017/040721
§ 371 (c)(1),
(2) Date: Jan. 4, 2019

(87) PCT Pub. No.: WO2018/009543
PCT Pub. Date: Jan. 11, 2018

(65) Prior Publication Data
US 2019/0166698 A1 May 30, 2019

Related U.S. Application Data

(60) Provisional application No. 62/359,365, filed on Jul. 7, 2016, provisional application No. 62/435,305, filed on Dec. 16, 2016.

(51) Int. Cl.
*H01R 43/00* (2006.01)
*H05K 3/00* (2006.01)
(Continued)

(52) U.S. Cl.
CPC ......... *H05K 3/0014* (2013.01); *H05K 1/0284* (2013.01); *H05K 1/0373* (2013.01);
(Continued)

(58) Field of Classification Search
CPC ....... H01L 2924/00; H01L 2924/07811; H01L 2924/3025; H01L 2224/73265;
(Continued)

(56) References Cited

U.S. PATENT DOCUMENTS 5,494,781 A 2/1996 Ohtani et al.
6,796,027 B2 9/2004 Suzuki et al.
(Continued)

FOREIGN PATENT DOCUMENTS

JP H05-299815 A 11/1993
JP H07-286280 A 10/1995
(Continued)

OTHER PUBLICATIONS

Panasonic Corporation, "MID Solutions", https://www3.panasonic.biz/ac/e/dl_center/index.jsp, downloaded Jun. 30, 2017.
(Continued)

*Primary Examiner* — Thiem D Phan

(57) ABSTRACT

In some embodiments, a manufacturing process includes injection molding a palladium-catalyzed material into a substrate, forming a thin copper film over exterior and exposed surfaces of the substrate; ablating or removing copper film from the substrate to provide first, second and optional third portions of the copper film and ablated sections; electrolytically plating each portion to form metallic-plated portions; and ablating or removing the second portion in order to isolate the first portion. The metallic-plated first portion comprises a circuit portion of a molded interconnect device (MID), and where the metallic-plated third portion comprises a Faraday cage portion of a MID. A soft etching step may be included. A solder resist application step can be added, along with an associated solder resist removal step.

4 Claims, 23 Drawing Sheets

(51) Int. Cl.
*H05K 1/02* (2006.01)
*H05K 1/03* (2006.01)
*H05K 3/02* (2006.01)
*H05K 3/24* (2006.01)
*H05K 3/42* (2006.01)

(52) U.S. Cl.
CPC ............ *H05K 3/027* (2013.01); *H05K 3/242* (2013.01); *H05K 3/426* (2013.01); *H05K 2201/0236* (2013.01); *H05K 2201/09118* (2013.01); *Y10T 29/5193* (2015.01)

(58) Field of Classification Search
CPC ..... H04N 5/2252; G01F 15/14; B81B 7/0064; Y10T 29/49117; Y10T 29/49155; Y10T 29/5193
USPC ...... 29/33 M, 33 K, 729, 745, 747, 846, 848
See application file for complete search history.

(56) References Cited

U.S. PATENT DOCUMENTS

| | | | |
|---|---|---|---|
| 7,399,661 | B2 | 7/2008 | Hiner et al. |
| 7,750,076 | B2 | 7/2010 | Laude et al. |
| 8,218,794 | B2 * | 7/2012 | Pahl ................. H04R 19/005 381/175 |
| 8,436,254 | B2 | 5/2013 | Yu et al. |
| 2008/0113205 | A1 | 5/2008 | Lichtenegger et al. |
| 2008/0212972 | A1 | 9/2008 | Nelson et al. |
| 2009/0127697 | A1 * | 5/2009 | Pahl ................. B81B 7/0054 257/698 |
| 2011/0303644 | A1 | 12/2011 | Macary |
| 2012/0134631 | A1 | 5/2012 | Chiang et al. |
| 2013/0206595 | A1 | 8/2013 | Lee et al. |
| 2016/0254424 | A1 | 9/2016 | Zitzlsperger et al. |

FOREIGN PATENT DOCUMENTS

| | | |
|---|---|---|
| JP | 2003-101190 A | 4/2003 |
| JP | 2004-214590 A | 7/2004 |
| JP | 2008-172167 A | 7/2008 |
| JP | 2010-080495 A | 4/2010 |
| JP | 2010-205929 A | 9/2010 |
| JP | 2011-249357 A | 12/2011 |
| JP | 2013-058728 A | 3/2013 |
| JP | 2013-125849 A | 6/2013 |
| JP | 2013-145174 A | 7/2013 |
| JP | 2016-086068 A | 5/2016 |
| KR | 2008-0010016 A | 1/2008 |
| KR | 10-1012138 B1 | 2/2011 |
| KR | 2014-0038126 A | 3/2014 |
| WO | 2018/009543 A1 | 1/2018 |

OTHER PUBLICATIONS

Panasonic Corporation, "MIPTEC", https://www3.panasonic.biz/ac/e/dl_center/index.jsp, downloaded Jun. 30, 2017.

Office action received for KR application No. 10-2019-7003055, dated Jul. 9, 2020, 11 pages. (6 pages of English translation and 5 pages of original copy).

Notification of Reason for Refusal received for Japanese application No. 2018-568743, dated Jan. 7, 2020, 13 pages. (7 pages of English translation and 6 pages of official copy).

International Search Report and Written Opinion received for PCT application No. PCT/US2017/040721, dated Sep. 21, 2017, 9 pages.

International Preliminary Report on Patentability received for PCT Application No. PCT/US2017/040721, dated Jan. 17, 2019, 8 pages.

Notification of Reason for Refusal received for KR application No. 10-2019-7003055, dated Mar. 16, 2020, 11 pages. (6 pages of English translation and 5 pages of original copy).

* cited by examiner

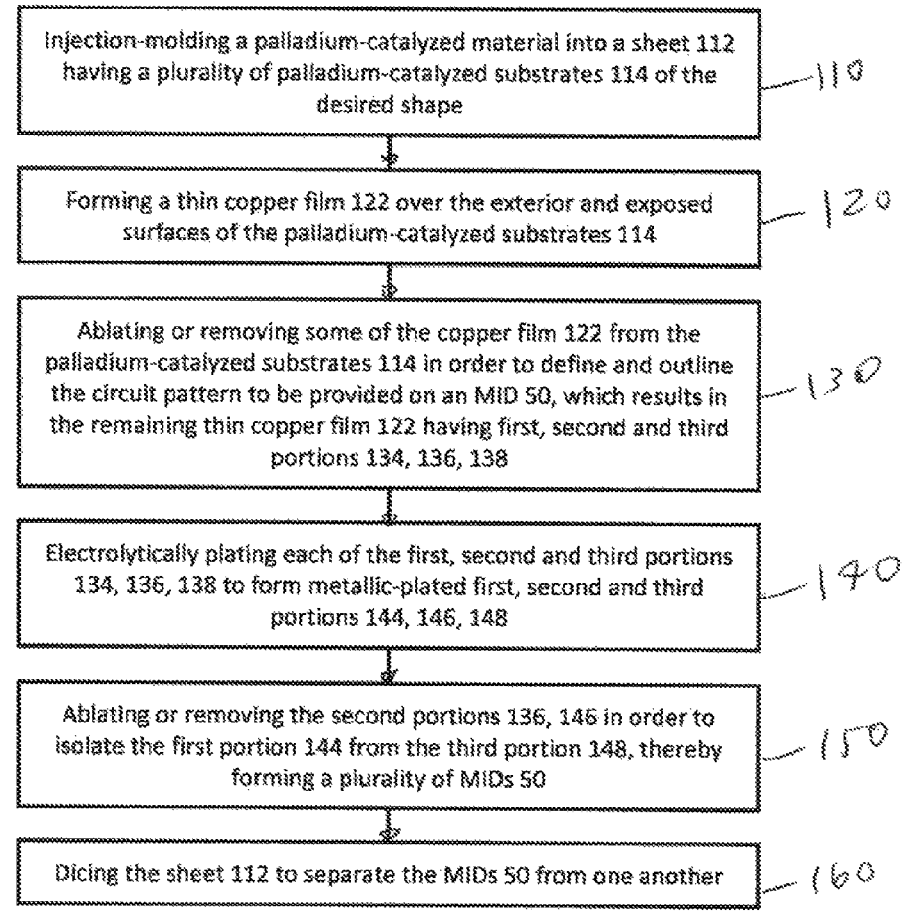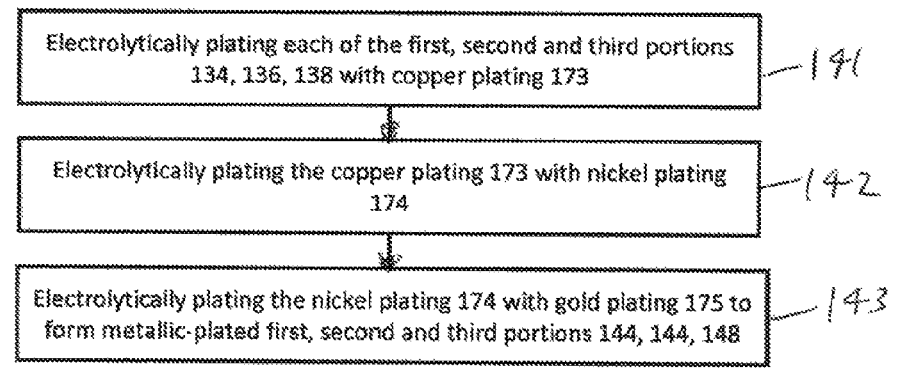

MOLDED INTERCONNECT DEVICE

RELATED APPLICATIONS

This application is a national stage of International Application No. PCT/US2017/040721, filed Jul. 5, 2017, which claims priority to U.S. provisional application Ser. No. 62/359,365, filed on Jul. 7, 2016, and U.S. provisional application Ser. No. 62/435,305, filed on Dec. 16, 2016, the contents of which are incorporated herein in their entireties.

BACKGROUND OF THE DISCLOSURE

Molded interconnect devices ("MIDs") are three-dimensional manufactured parts that typically include plastic components and electronic circuit traces. A plastic substrate or housing is created and electrical circuits and devices are plated, layered, or implanted upon the plastic substrate. MIDs typically have fewer parts than conventionally manufactured devices, which results in space and weight savings. Applications for MIDs include mobile telephones, automated teller machines, steering wheel components for automobiles, RFID components, lighting, medical devices and many other consumer and/or commercial products.

Current processes for manufacturing MIDs include two-shot molding, laser direct structuring technology (LDS), microscopic integrated processing technology (MIPTEC), and a laser developed additive technology. Each of these manufacturing processes have been known in the art for some time, yet each has its own drawbacks such that many individuals believe that further improvements to manufacturing MIDs would be beneficial.

Two-shot molding involves the use of two separate plastic parts, typically one platable and one non-platable. The platable part forms the circuitry, and the non-platable part fulfills mechanical functions and completes the molding. The two parts are fused together and circuits are created through use of electroless plating. The platable plastic is metallized, while the non-platable plastic remains non-conductive.

LDS technology involves the steps of injection molding (using any of a variety of dielectric thermoplastic materials, including polyamide, polycarbonate, and liquid crystal polymer), laser activation of the thermoplastic material, and then metallization (electroless plating). The laser etches a wiring pattern onto the part and prepares it for metallization. With LDS, only a single thermoplastic material is required thereby making the molding step a one-shot process, and generally preferable as compared to the two-shot molding process.

MIPTEC technology, which is offered by Panasonic Corporation, involves a molding stage, a circuit forming stage, a plating stage, and a cutting stage.

The molding stage includes injection-molding the intended shape using a thermoplastic resin, such as polyphthalamide (PPA).

The circuit forming stage includes two steps, namely: (1) metallization; and (2) patterning. Thin copper film is formed in the base metallization process (copper-strike). A laser is then used to remove the copper and outline the circuit pattern, with the wavelength and exposure time of the laser optimized to achieve copper removal without damaging the substrate.

The plating stage includes two or three steps, namely: (1) electrolytic copper plating; (2) optional soft etching; and (3) electrolytic nickel and gold plating. First, copper is electrically plated to form the circuit pattern. Then, if desired, soft etching is applied to remove unnecessary copper-strike that was not removed by laser in the circuit forming stage. Finally, nickel and gold are plated on the electrolytically-plated copper, forming the circuit pattern to help prevent oxidation and corrosion.

An optional cutting stage then includes dicing the sheet form into individual MIDs.

Thus, MIPTEC technology, like LDS technology, has only a one-shot molding process, but also provides MIDs which can be fine patterned and bare chip mounted.

The laser developed additive technology is similar to the MIPTEC technology, but allows for other thermoplastic materials, such as polyamide (PA), polycarbonate (PC) and acrylonitrile butadiene styrene (ABS) or liquid crystal polymer (LCP), to be used in the process. Like polyphthalamide (PPA), however, these thermoplastic materials are all dielectric materials and require the separate and extra step of surface activation treatment prior to the circuit forming stage. This extra step adds both time and expense to these technologies.

MIPTEC and LDS technology processes have limitations, and in some circumstances even impossibilities, in connection with plating features that are not within a line-of-sight. For instance, as illustrated in FIGS. 25 and 26, a through-hole type via 60 is illustrated. Plating of the through-hole type via 60, as illustrated in FIG. 25, could not be achieved with a MIPTEC technology process because the chemical applied to the surface of the plastic would also need to be applied to the vertical walls of the via 60. Plating of the through-hole type via 60, as illustrated in FIG. 26, could not be achieved with a LDS technology process because vertical walls could not be achieved due to laser activation required angle of incidence. FIG. 27 illustrates a different line-of-sight feature 70, referred to herein as an overhang or an undercut, which likely is not possible with a MIPTEC and/or LDS technology process.

BRIEF SUMMARY OF THE DISCLOSURE

A first preferred embodiment of a manufacturing process includes the steps of: injection molding a palladium-catalyzed material, such as, for example, resins or epoxy molding compounds into a palladium-catalyzed substrate of a desired shape; forming a thin copper film over exterior and exposed surfaces of the palladium-catalyzed substrate; ablating or removing some of the copper film from the palladium-catalyzed substrate to provide first, second and optional third portions of the copper film; electrolytically plating each of the first, second and third portions of the copper film to form metallic-plated first, second and third portions; and ablating or removing the second portion in order to isolate the metallic-plated first portion from the metallic-plated third portion, where the metallic-plated first portion comprises a circuit portion of portion of a molded interconnect device (MID), and where the metallic-plated third portion comprises a Faraday cage portion of the MID.

A second preferred embodiment of a manufacturing process includes the steps of: injection molding a palladium-catalyzed material, such as, for example, resins or epoxy molding compounds into a palladium-catalyzed substrate of a desired shape; forming a thin copper film over exterior and exposed surfaces of the palladium-catalyzed substrate; ablating or removing some of the copper film from the palladium-catalyzed substrate to provide first, second and optional third portions of the copper film; electrolytic copper plating; soft etching to remove any unnecessary copper; electrolytic nickel plating; electrolytic gold plating; and ablating or removing the second portion in order to isolate the metallic-plated first portion from the metallic-plated third portion, where the metallic-plated first portion comprises a circuit portion of the MID, and where the metallic-plated third portion comprises a Faraday cage portion of the MID.

A third preferred embodiment of a manufacturing process includes the steps of: injection molding a palladium-catalyzed material, such as, for example, resins or epoxy molding compounds into a palladium-catalyzed substrate of a desired shape; forming a thin copper film over exterior and exposed surfaces of the palladium-catalyzed substrate; ablating or removing some of the copper film from the palladium-catalyzed substrate to provide ablated sections and first, second and optional third portions of the copper film; electrolytically plating each of the first, second and third portions of the copper film with copper plating; non-selectively adding solder resist; selectively removing the solder resist from parts of the first portion which will form contact points for connection of the MID to an associated device or assembly, such as a printed circuit board, and from the ablated sections; electrolytically plating the contact points with nickel plating and gold plating to form metallic-plated first, second and third portions; and ablating or removing the second portion in order to isolate the metallic-plated first portion from the metallic-plated third portion, where the metallic-plated first portion comprises a circuit portion of the MID, and where the metallic-plated third portion comprises a Faraday cage portion of the MID.

A fourth preferred embodiment of a manufacturing process includes the steps of: injection molding a palladium-catalyzed material, such as, for example, resins or epoxy molding compounds into a palladium-catalyzed substrate of a desired shape; forming a thin copper film over exterior and exposed surfaces of the palladium-catalyzed substrate; ablating or removing some of the copper film from the palladium-catalyzed substrate to provide ablated sections and first, second and optional third portions of the copper film; electrolytically plating each of the first, second and third portions of the copper film with copper plating, nickel plating and gold plating; non-selectively adding solder resist; selectively removing the solder resist from parts of the first portion which will form contact points for connection of the MID to an associated device or assembly, such as a printed circuit board, and from the ablated sections; and ablating or removing the second portion in order to isolate the metallic-plated first portion from the metallic-plated third portion, where the metallic-plated first portion comprises a circuit portion of the MID, and where the metallic-plated third portion comprises a Faraday cage portion of the MID.

Each manufacturing process results in an MID having a palladium-catalyzed substrate, a circuit portion, and an optional Faraday cage portion, where the Faraday cage portion and the circuit portion may be isolated from one another.

These and other aspects and features of the invention are described in further detail below.

BRIEF DESCRIPTION OF THE SEVERAL VIEWS OF THE DRAWINGS

FIG. 1 is a flow chart showing the steps of a first embodiment of a process of manufacturing a molded interconnect device (MID);

FIG. 2 is a flow chart showing the sub-steps of an electrolytic plating step of the first embodiment of the manufacturing process;

DETAILED DESCRIPTION OF THE INVENTION

The present disclosure is directed to novel manufacturing processes 100, 200, 300, 400 for forming a molded interconnect device (MID) 50. The manufacturing processes 100, 200, 300, 400 are useful for the creation of MIDs, such as printed circuit boards, flex circuits, connectors, thermal management features, electromagnetic interference (EMI) shielding, high current conductors, radio frequency identification (RFID) apparatuses, antennas, wireless power, sensors, MEMS apparatuses, LEDs, microprocessors and memory, ASICs, passives, and other electrical and electromechanical apparatuses.

Attention is directed to FIGS. 1-16 relating to a first embodiment of the manufacturing process 100 used to form the MID 50. FIG. 1 illustrates a flow chart depicting the steps of the manufacturing process 100. FIG. 2 illustrates a flow chart depicting the steps of a sub-process of the manufacturing process 100. The manufacturing process 100 includes a molding stage, a circuit forming stage, a plating stage, and a cutting stage.

Figure 3:
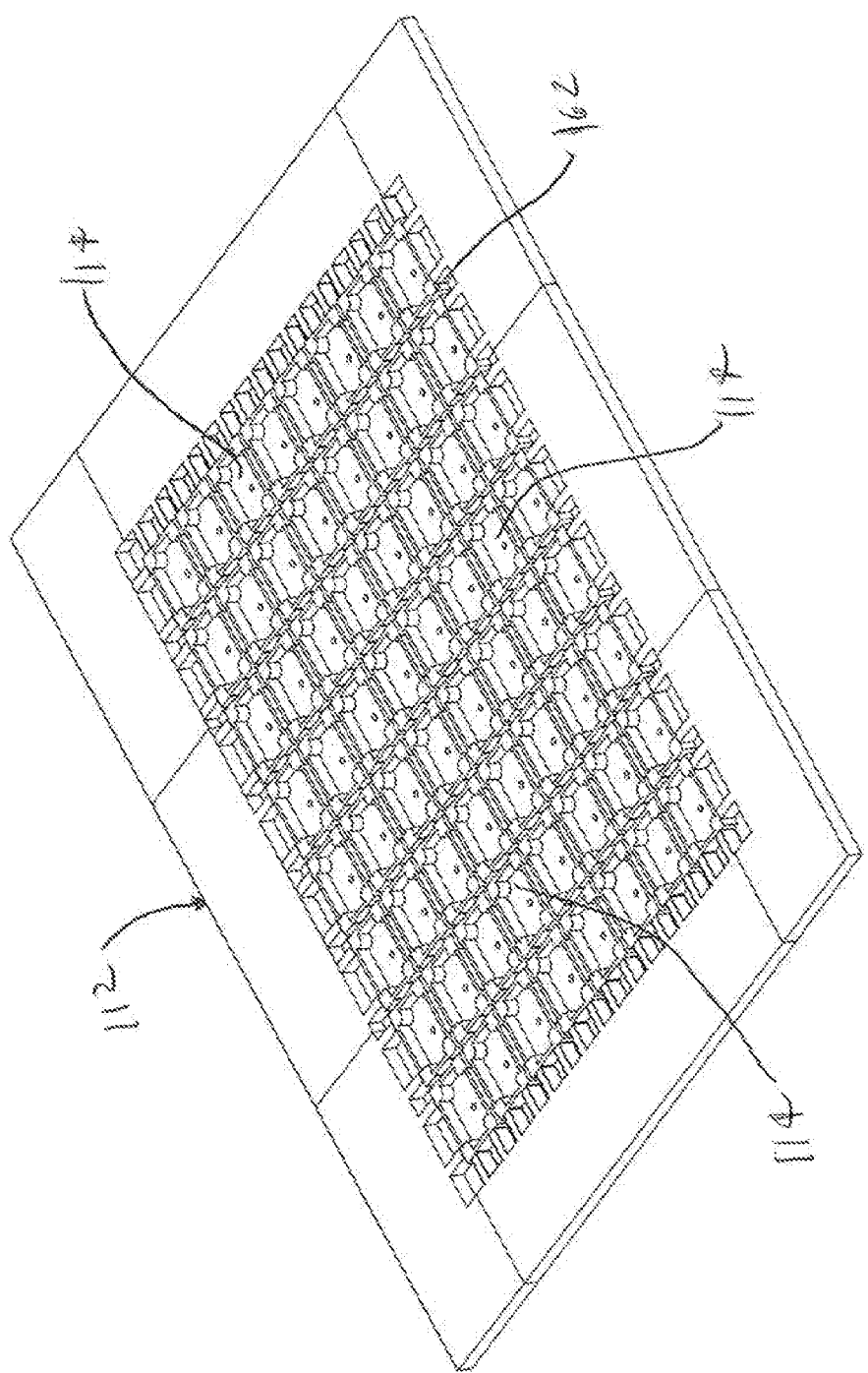
FIG. 3 is a perspective view of a sheet.
Figure 4:
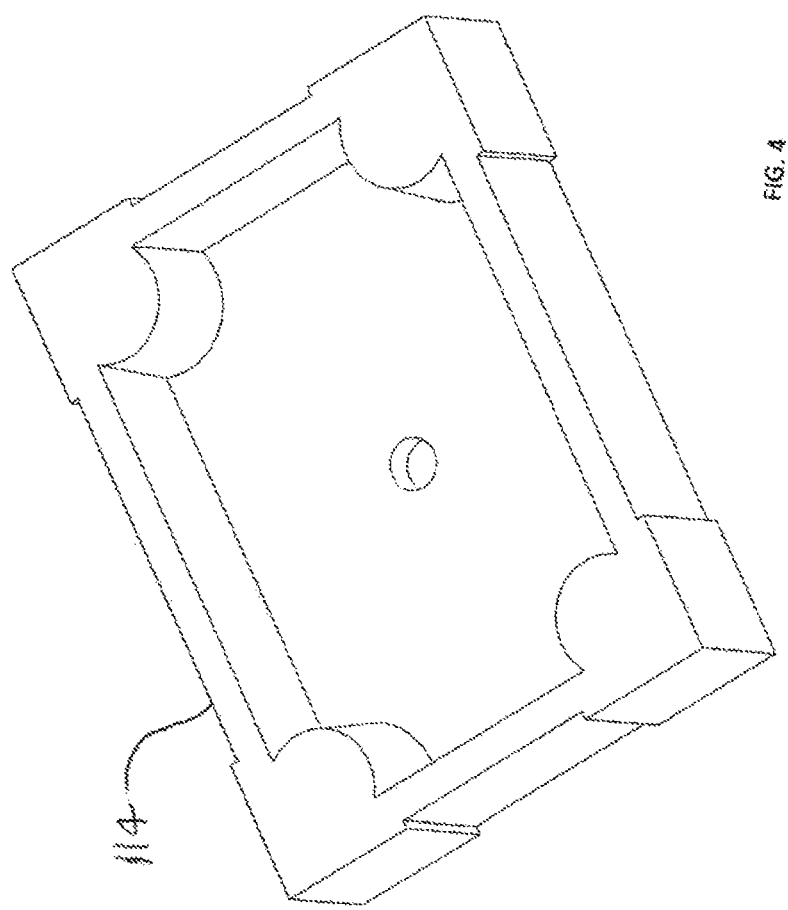
FIG. 4 is a perspective view of one of the substrates separated from the sheet.
Figure 5:
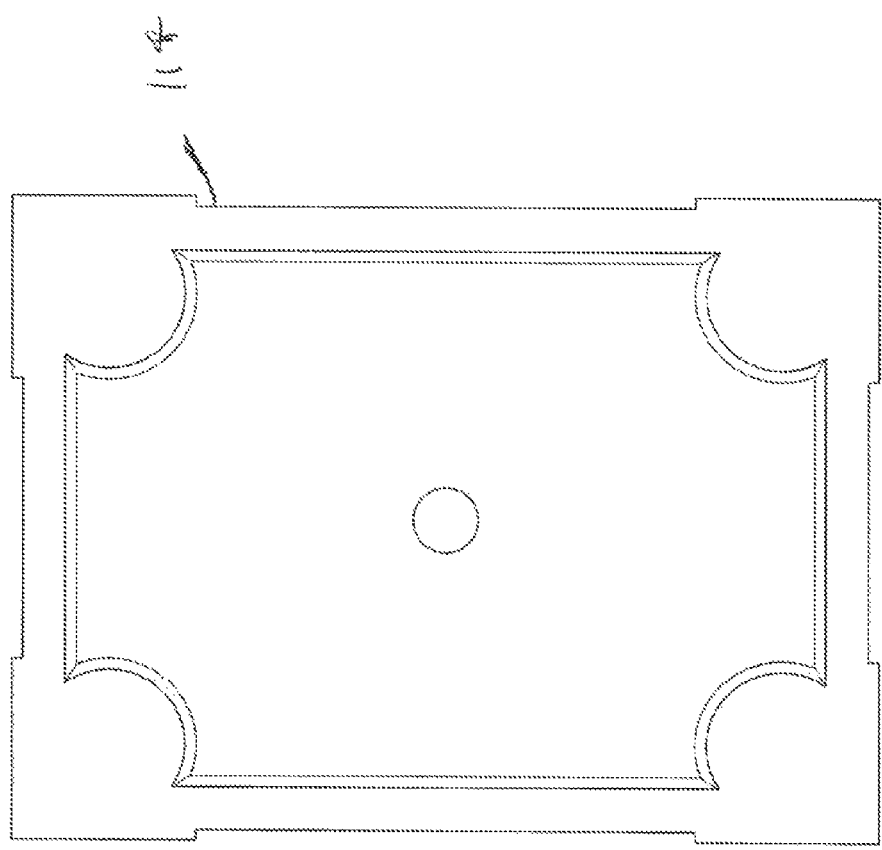
FIG. 5 is a top plan view of the substrate of FIG. 4.
Figure 6:
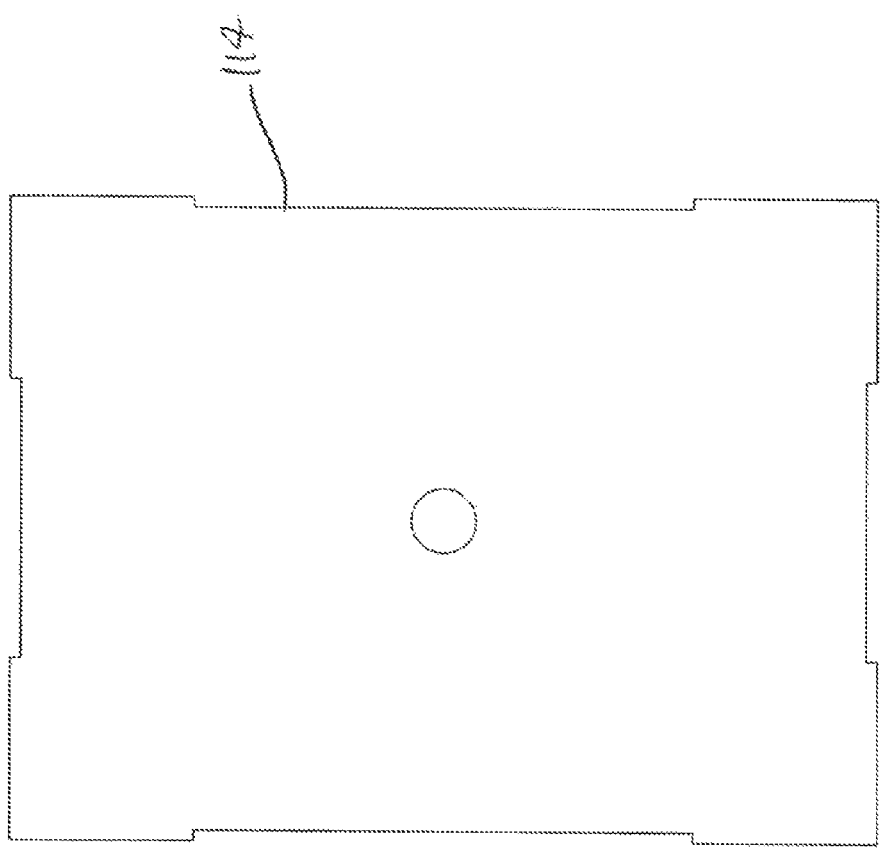
FIG. 6 is a bottom plan view of the substrate of FIG. 4.

The molding stage of the manufacturing process 100 advantageously includes only a single step, which step will be referenced by reference numeral 110. Step 110 is an injection-molding step where a palladium-catalyzed material (sometimes called palladium-doped in the art), such as, for example, resins or epoxy molding compounds, is injection-molded in the form of a sheet 112 containing a plurality of connected substrates 114 (each formed in the intended shape) for production purposes. Each substrate 114 may be formed in a desired three-dimensional shape. In some embodiments, each substrate 114 is formed of the same three-dimensional shape. FIG. 3 illustrates the formation of the MID 50 after the completion of step 110, where the sheet 112 contains the plurality of substrates 114. FIGS. 4-6 illustrate a singulated substrate 114. The material which is injection-molded is a palladium-catalyzed resin, but is intended to be inclusive of materials where the palladium (or any comparable material that does not need to be surface treated to accept metallization) is provided within, or infused within, the material itself.

The circuit forming stage of the manufacturing process 100 includes two steps, which steps will be referred to as steps 120 and 130.

Figure 7:
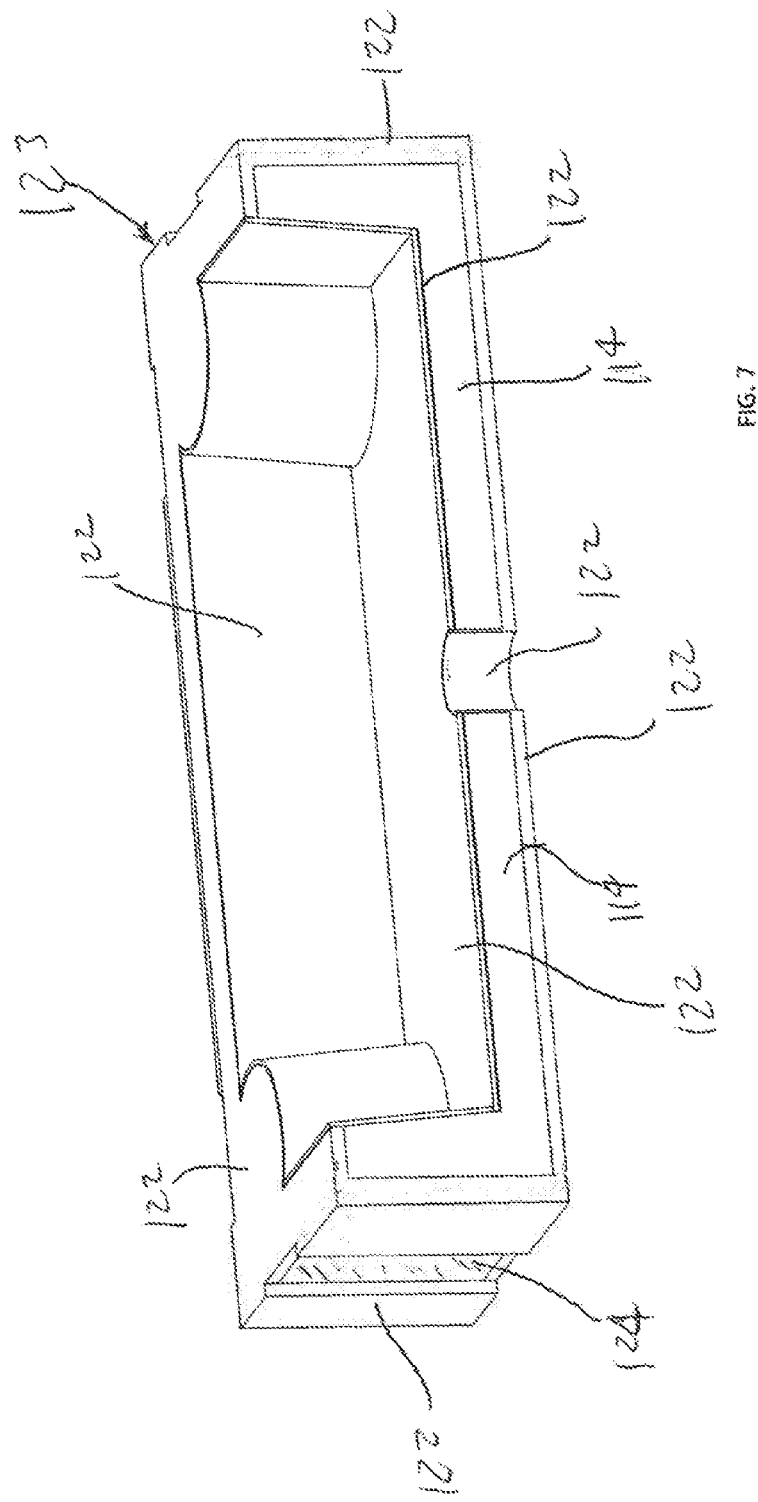
FIG. 7 is a cross-sectional view of a first assembly.

Step 120 is a metallization step where a thin copper film 122 is formed over the exterior and exposed surfaces of the palladium-catalyzed substrates 114 to form a first assembly 123. Metallization step 120 is commonly referred to as copper-striking. FIG. 7 illustrates the formation of the MID 50 after the completion of step 120, where the substrate 114 has the copper film 122 formed thereon (the first assembly 123 is shown in cross-section for clarity to show the substrate 114). Sections 124 (shown with shading for clarity) which do not have the copper film 122 formed thereon are where the substrate 114 is connected to the adjacent substrate 114 in the sheet 112. Sections 124 are illustrative only and do not denote required locations for the connection points.

Figure 8:
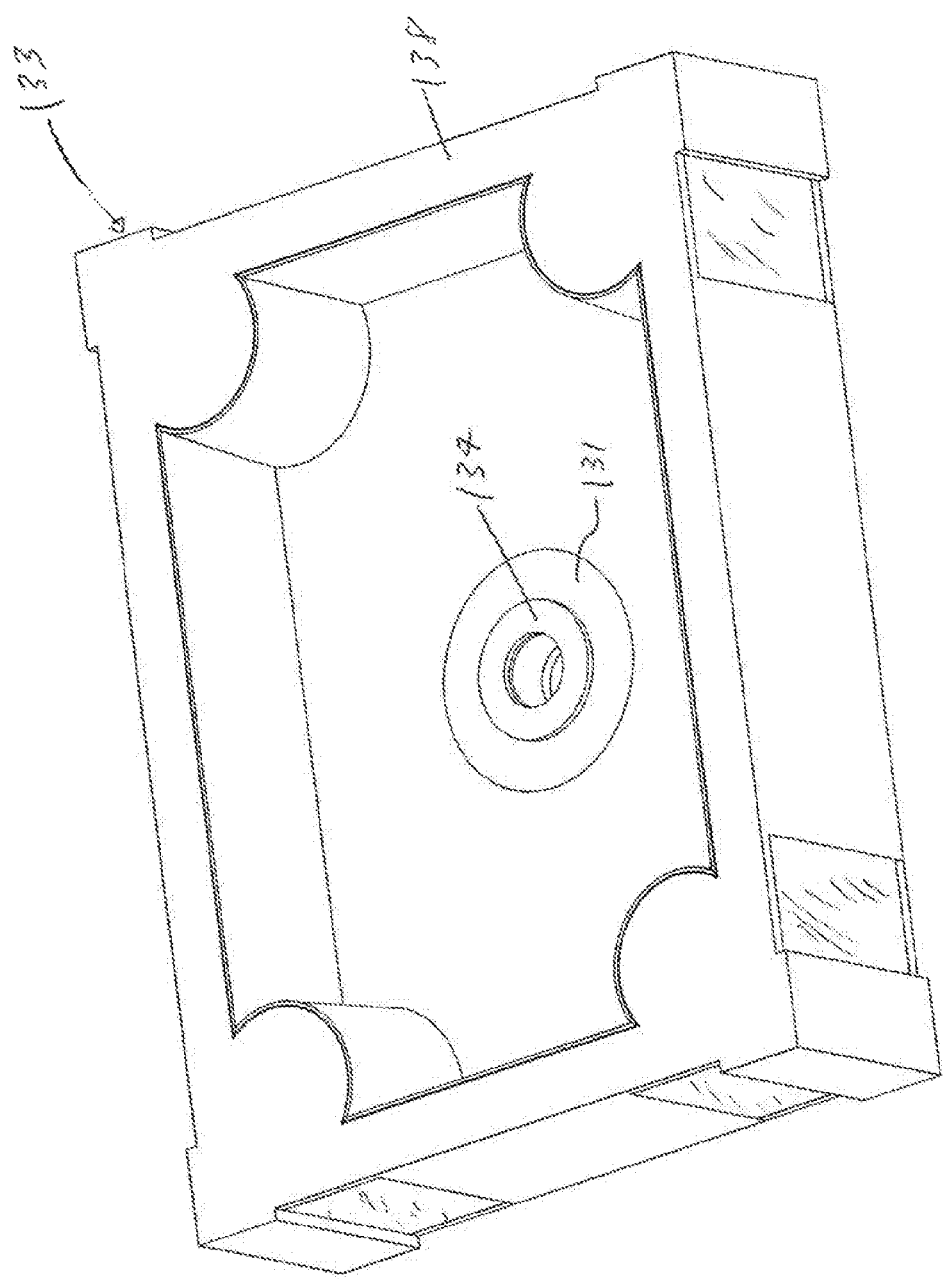
FIG. 8 is a perspective view of a second assembly.
Figure 9:
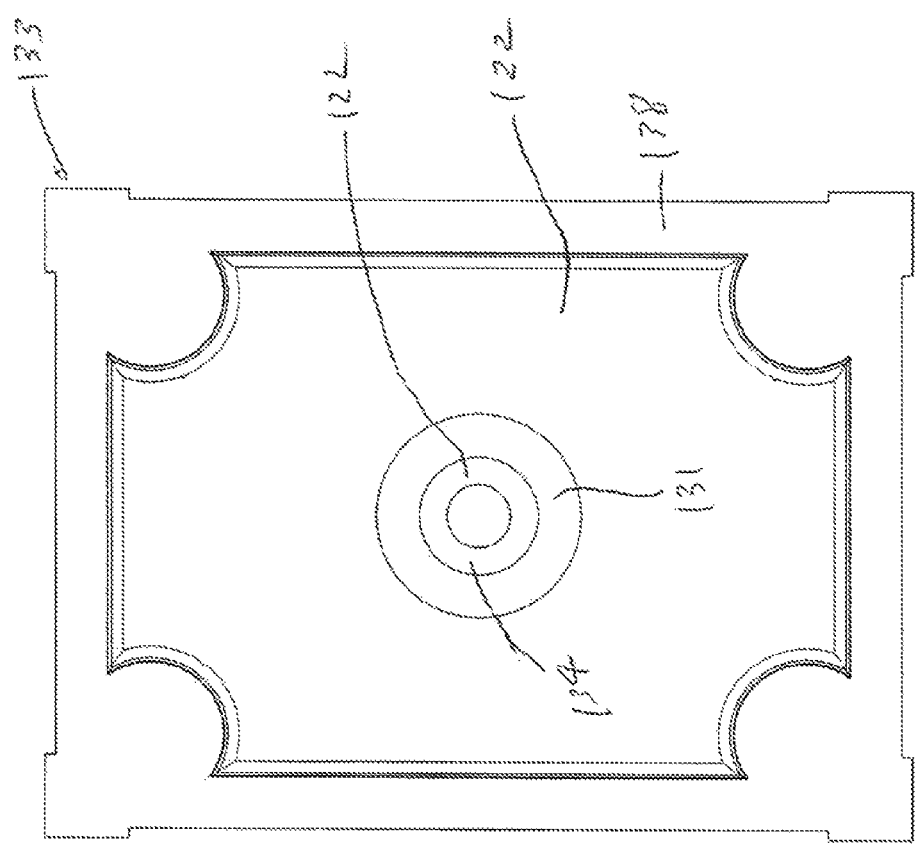
FIG. 9 is a top plan view of the second assembly of FIG. 8.
Figure 10:
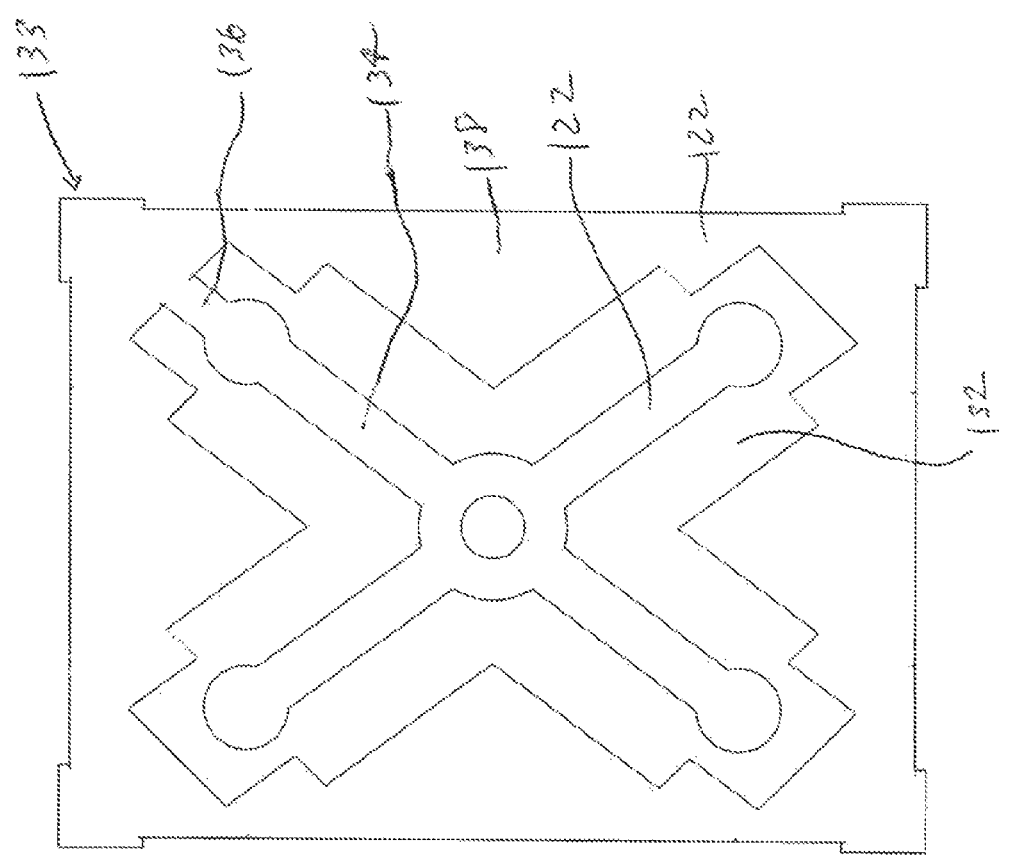
FIG. 10 is a bottom plan view of the second assembly of FIG. 8.

Step 130 is a circuit patterning step where a laser (not shown) ablates or removes portions of the copper film 122 from the first assembly 123 to expose portions 131, 132 of the substrate 114 and form a second assembly 133. This action defines and outlines a circuit pattern within the remaining copper film 122 to be provided for the MID 50. FIGS. 8-10 illustrate the formation of the MID 50 after the completion of step 130, where the non-ablated/removed copper film 122 preferably includes first, second and optional and selectively sized/shaped third portions 134, 136, 138 which are to be subject to the plating stage, as will be described further below. The first portion 134 forms the circuit pattern, the second portion(s) 136 forms a bus portion (s) which connects the first portion 134 to the third portion(s) 138, if provided, and the third portion(s) 138, if provided, is/are generally a Faraday cage portion (hereinafter, the second portion(s) 136 is referred to in the singular, but more than one second portion 136 may be provided; hereinafter, the third portion(s) 138 is referred to in the singular, but more than one third portion 138 may be provided). The remaining steps will be described and illustrated showing the third portion(s) 138 with the understanding that the size/shape of the third portion(s) 138 could be changed as desired, and also with the understanding that the third portion(s) 138 could not be provided at all.

The plating stage of the manufacturing process 100 includes two steps, which steps will be referred to as steps 140 and 150.

Figure 11:
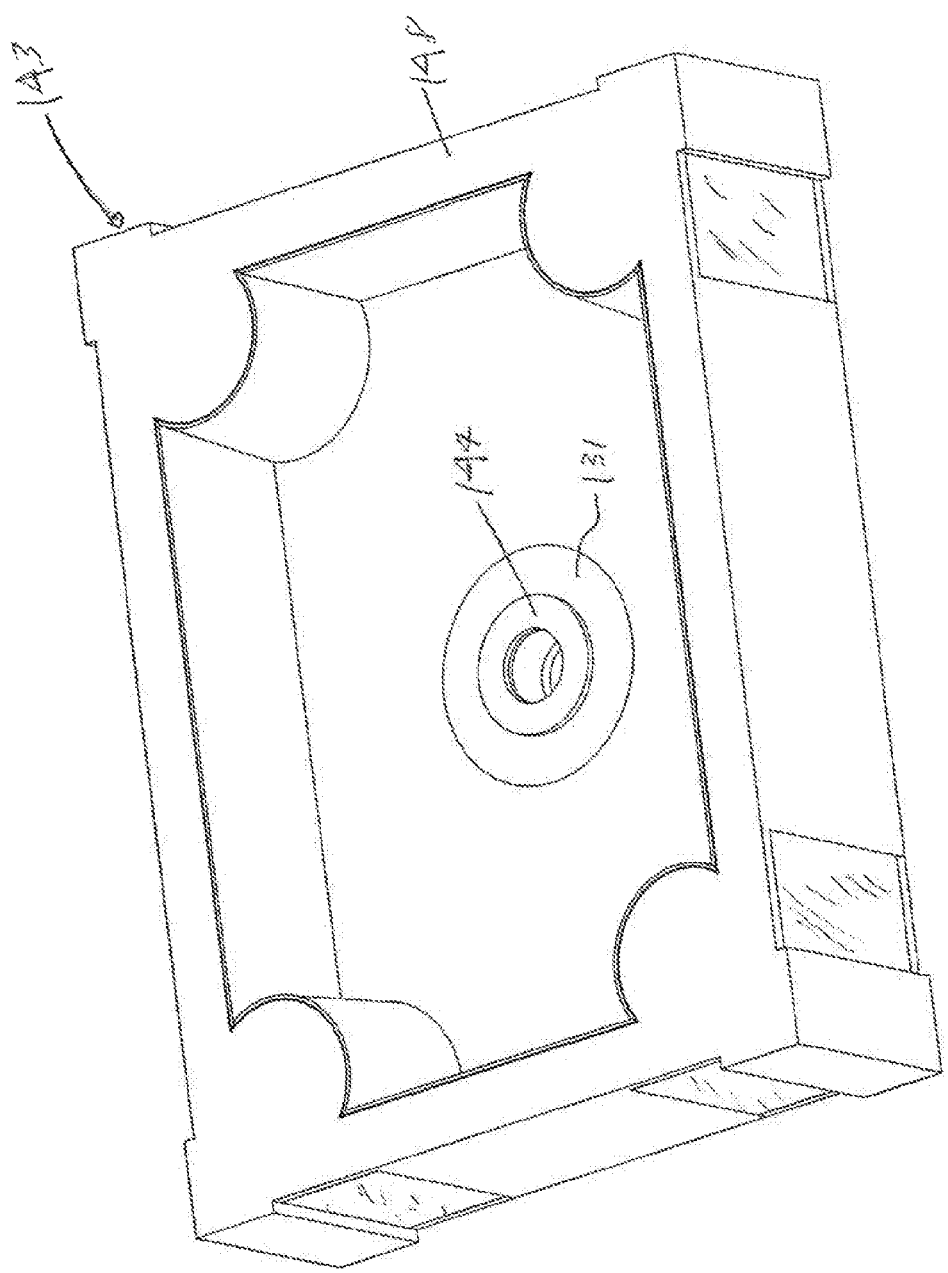
FIG. 11 is a perspective view of a third assembly.
Figure 12:
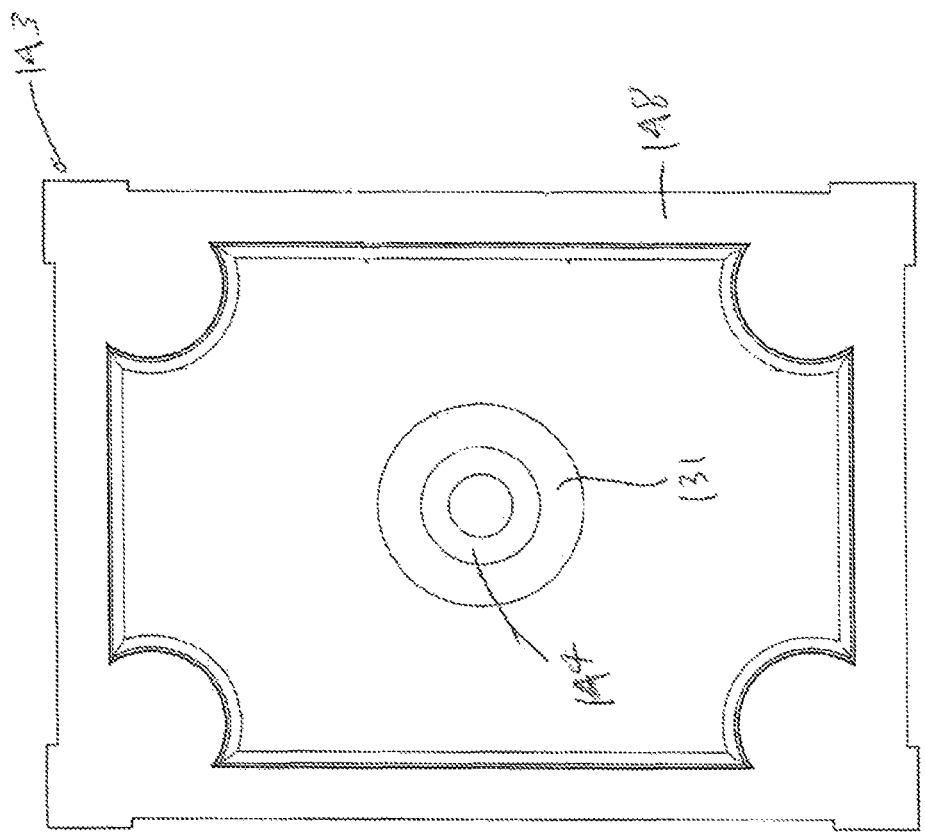
FIG. 12 is a top plan view of the third assembly of FIG. 11.
Figure 13:
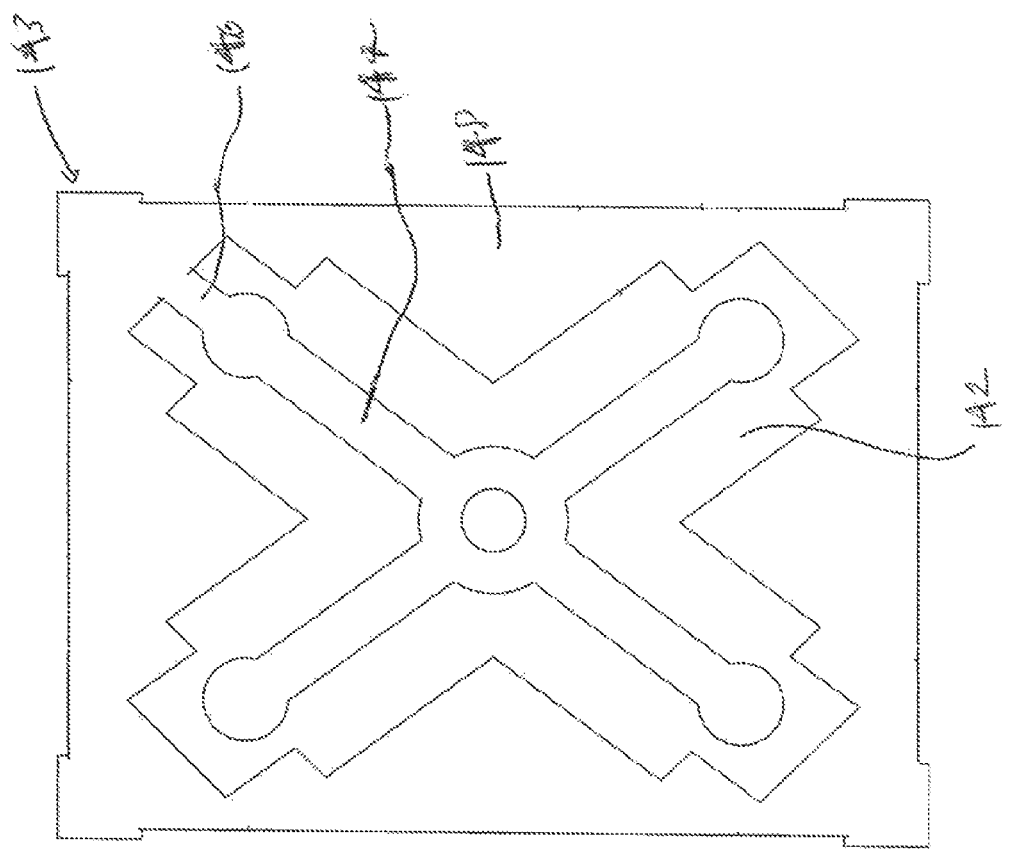
FIG. 13 is a bottom plan view of the third assembly of FIG. 11.

Step 140 is an electrolytic plating step where a probe (not shown) is attached/connected to one of the first, second and third portions 134, 136, 138 and electricity is run through the first, second and third portions 134, 136, 138 and desired metallic molecules from a desired metallic bath are drawn to and secured to the first, second and third portions 134, 136, 138, until the desired metallic plating of the first, second and third portions 134, 136, 138 is built up to the desired thickness, thus forming metallic-plated first, second and third portions 144, 146, 148 (it is to be understood that metallic-plated third portion 148 will only be formed if third portion 138 is provided), thereby forming a third assembly 143. FIGS. 11-13 illustrate the formation of the MID 50 after the completion of step 140.

Figure 15:
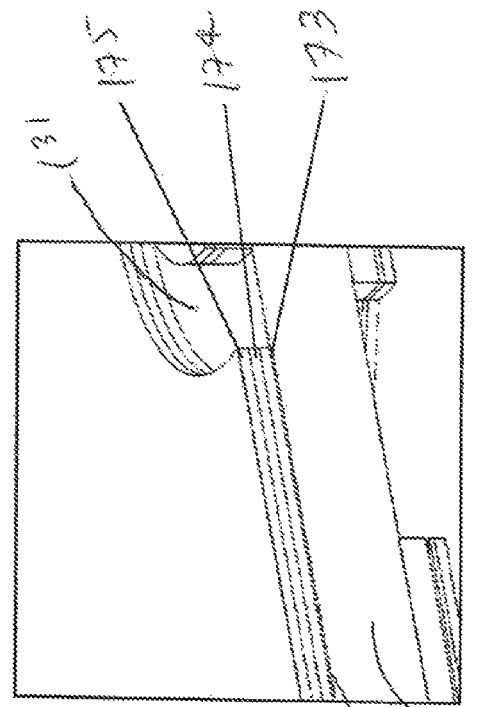
FIG. 15 is an enlarged view of a portion of FIG. 14.
Figure 14:
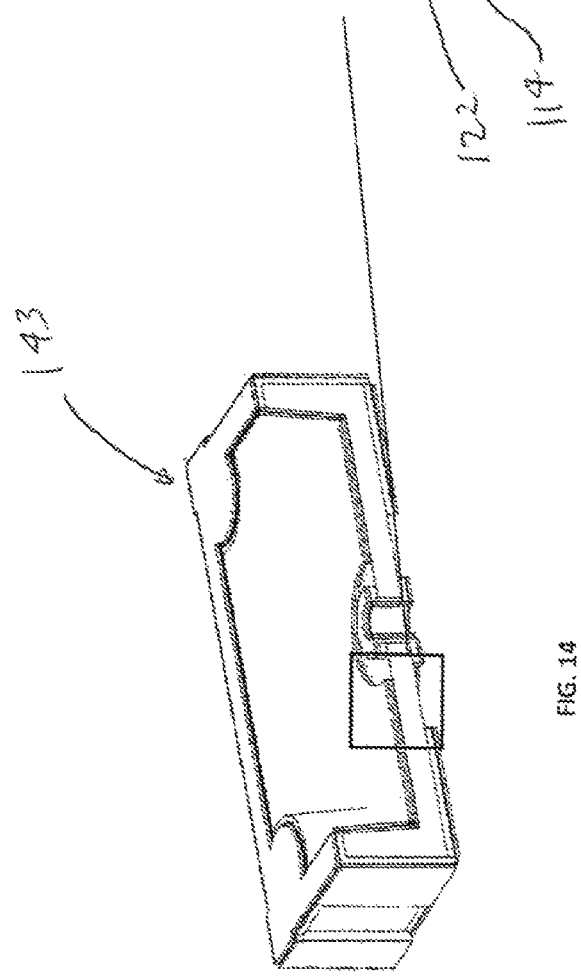
FIG. 14 is a cross-sectional view, shown in perspective, of the third assembly of FIG. 11, in accordance with an embodiment.

It is to be understood that the electrolytic plating step 140 can include the electrolytic plating of any metal(s) as desired. In a preferred embodiment, the electrolytic plating step 140 begins with a step 141 wherein a copper material is electrolytic plated onto the first, second and third portions 144, 146, 148 to form a copper plating 173, followed by a step 171 wherein a nickel material is electrolytic plated onto the copper material 173 to form a nickel plating 174, followed by a step 172 wherein a gold material is electrolytic plated onto the nickel material 147 to form a gold plating 175, as illustrated in FIGS. 14 and 15.

Figure 16:
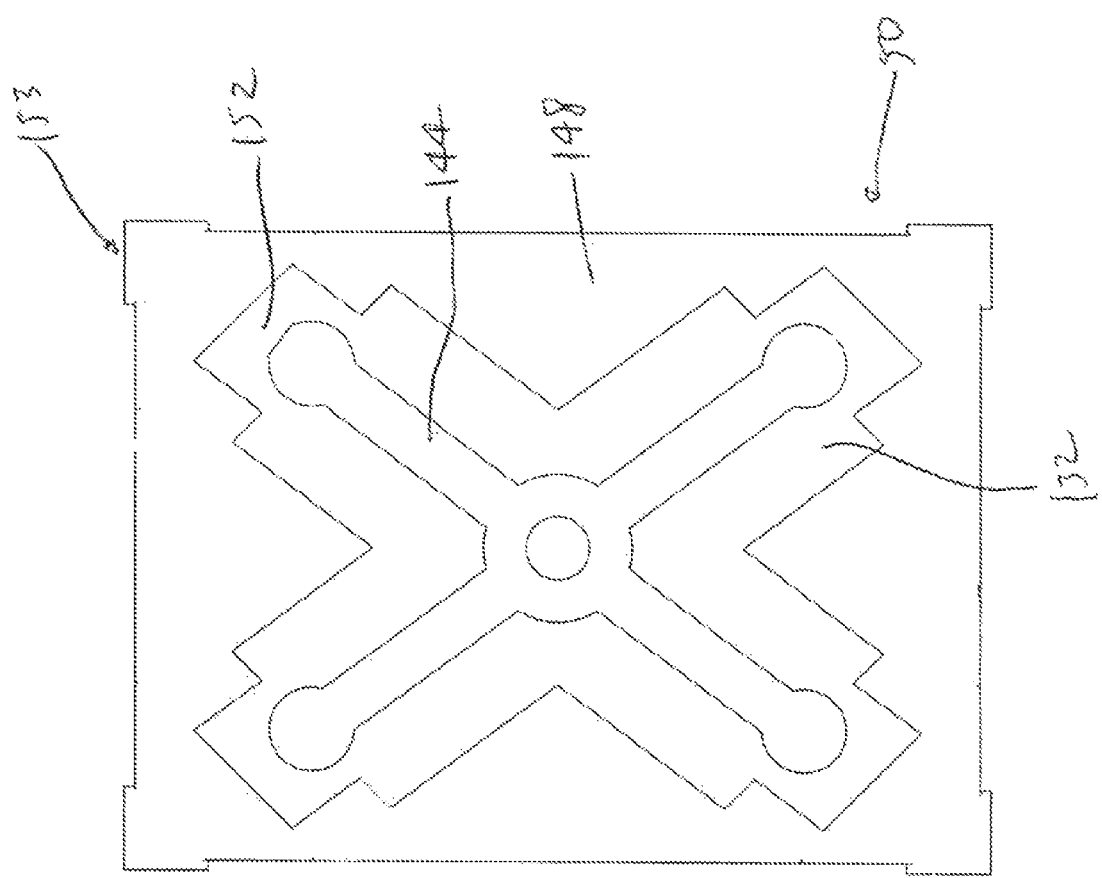
FIG. 16 is a perspective view of a fourth assembly.

Step 150 is a circuit isolation step where a laser (not shown) ablates or removes the formed second (bus) portion (s) 136/146, beginning with second portion 146, and finishing with second portion 136, until the surface of the substrate 114 is provided between the first and third portions 144, 148, thereby providing portions 152 of the substrate 114 which are visible, and thereby forming a fourth assembly 153. The ablated sections 152 are connected to or continuous with the ablated sections 132 such that the first portion 144 (namely the circuit pattern) is isolated from the third portion 148 (namely the Faraday cage portion). FIG. 16 illustrates the MID 50 that is formed after the completion of step 150.

Step 160 is a cutting step where the sheet 112 is diced in order to separate each of the MIDs 50. The sheet 112 can be diced along saw streets 162 (the saw streets 162 are not shown in FIGS. 4-16), thereby exposing the sections 124.

Either before or after step 160 of the manufacturing process 100 is performed, one or more of the MIDs 50 can then be inspected, as desired and in any of a number of known manners, to ensure that the MIDs 50 are suitable for their intended use. The MIDs 50 may then be packaged and shipped. If desired, further electronic components may be electrically connected and secured to the first portion 144, namely the circuit portions, before the MIDs 50 are packaged and shipped. It is to be understood that the sheet 112 of MIDs 50 could be packaged and shipped prior to the cutting step 160 being performed.

Figure 17:
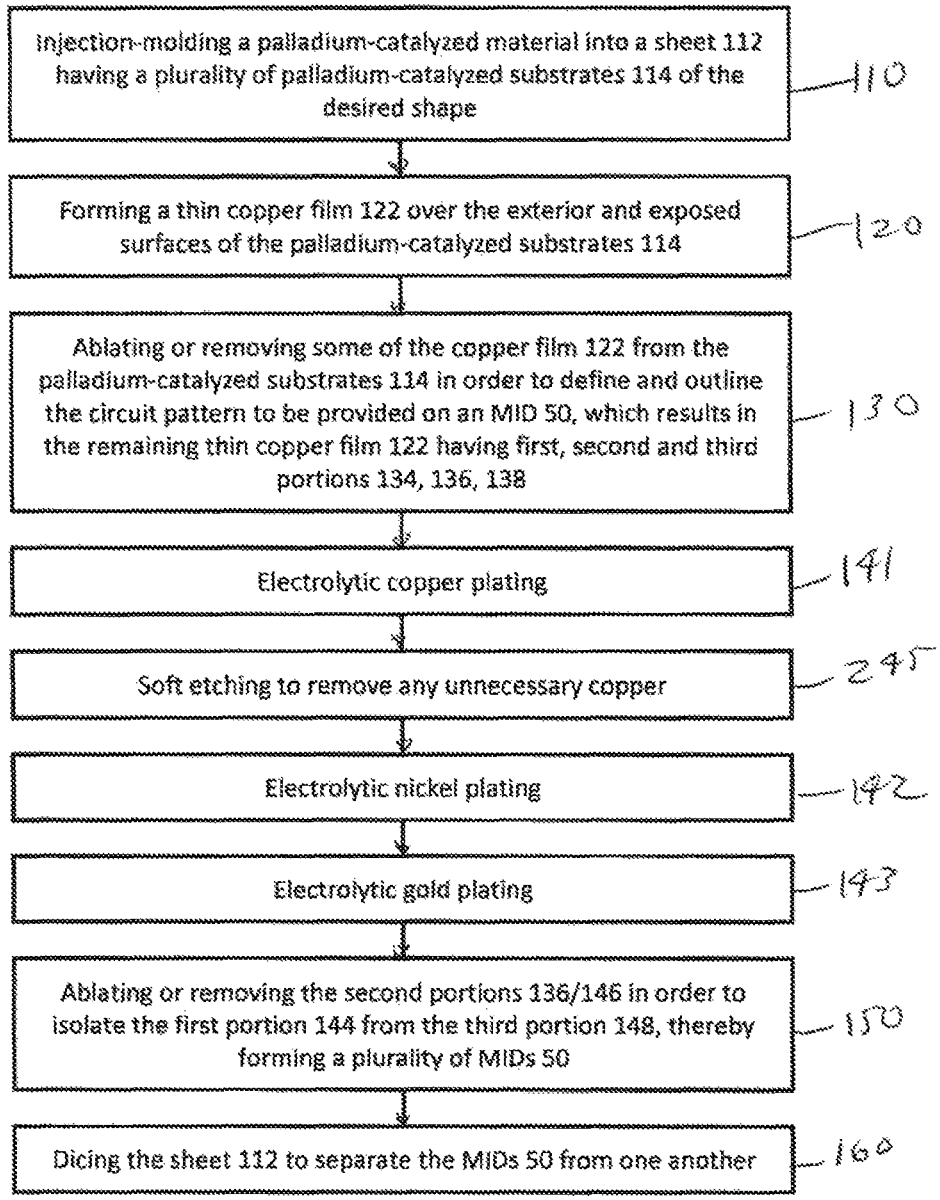
FIG. 17 is a flow chart showing the steps of a second embodiment of a process of manufacturing a molded interconnect device (MID)

Attention is directed to FIG. 17 relating to a second embodiment of the manufacturing process 200 used to form the MID 50. FIG. 17 illustrates a flow chart depicting the steps of the manufacturing process 200. Like manufacturing process 100, manufacturing process 200 includes a molding stage, a circuit forming stage, a plating stage, and a cutting stage. Manufacturing process 200 includes each of the same steps 110, 120, 130, 140 (including steps 141, 142, 143), 150, 160 from manufacturing process 100, but also includes a further step 245 that would preferably be a part of the plating stage. Step 245 is a soft etching step which would preferably be performed after step 141, but before step 142. As a part of the soft etching step 245, soft etching would be applied in order to remove any unnecessary copper from areas that are not part of the first, second or third portions 144, 146, 148 of the MID 50 and to prevent any unnecessary nickel and/or gold plating.

Figure 18:
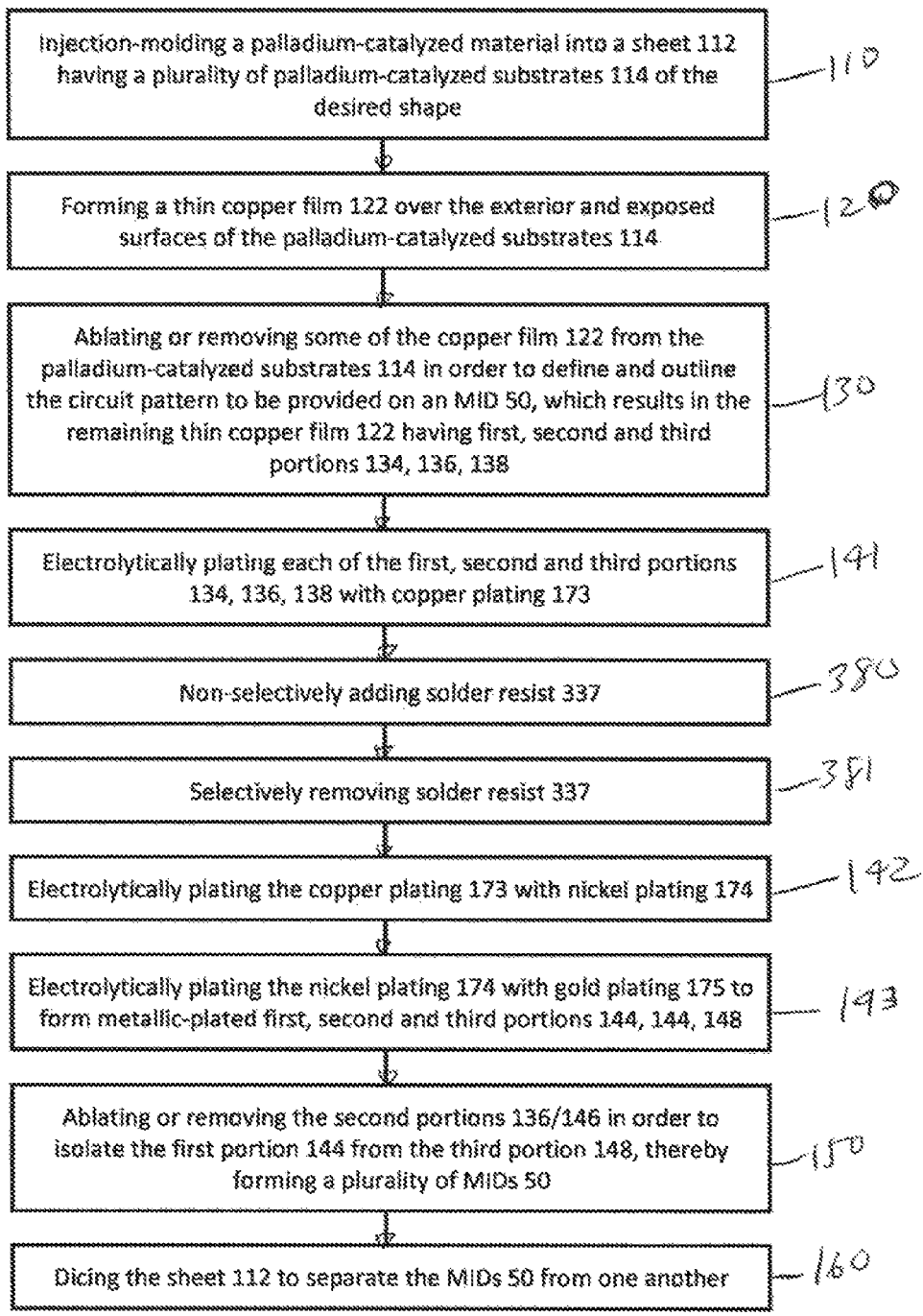
FIG. 18 is a flow chart showing the steps of a third embodiment of a process of manufacturing a molded interconnect device (MID)

Attention is directed to FIGS. 18-21 relating to a third embodiment of the manufacturing process 300 used to form the MID 50. FIG. 18 illustrates a flow chart depicting the steps of the manufacturing process 300. Like manufacturing process 100, manufacturing process 300 includes a molding stage, a circuit forming stage, a plating stage, and a cutting stage. Manufacturing process 300 includes each of the same steps 110, 120, 130, 141, 142, 143, 150, 160 from manufacturing process 100, also includes steps 380, 381 after step 141 and before step 142. The soft etching step 245 may be included after step 141.

Figure 19:
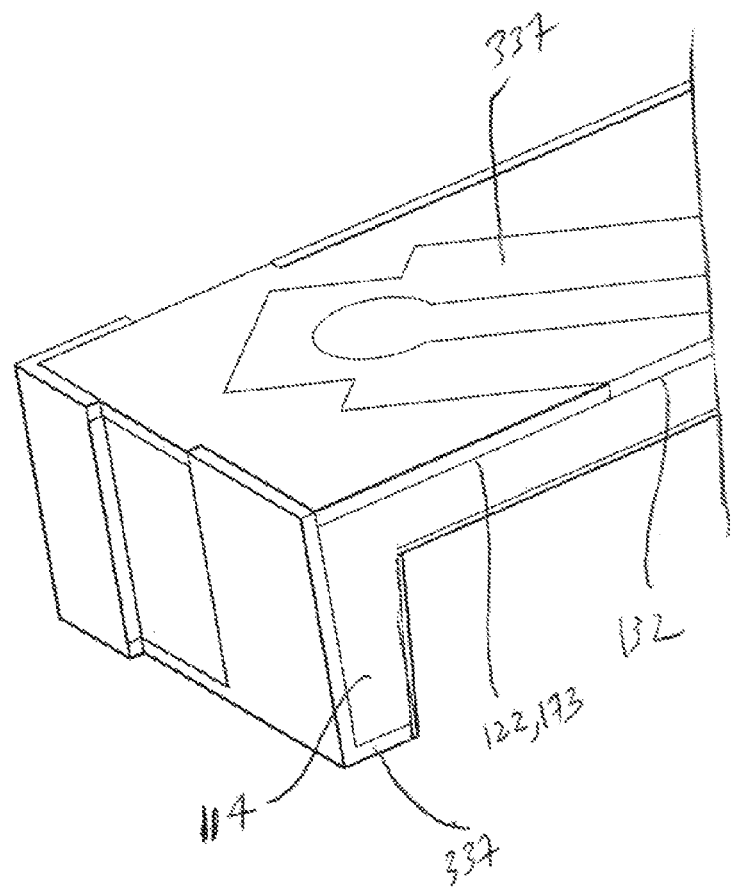
FIG. 19 is a partial perspective, cross-sectional view of the MID during formation in accordance with the third embodiment.
Figure 20:
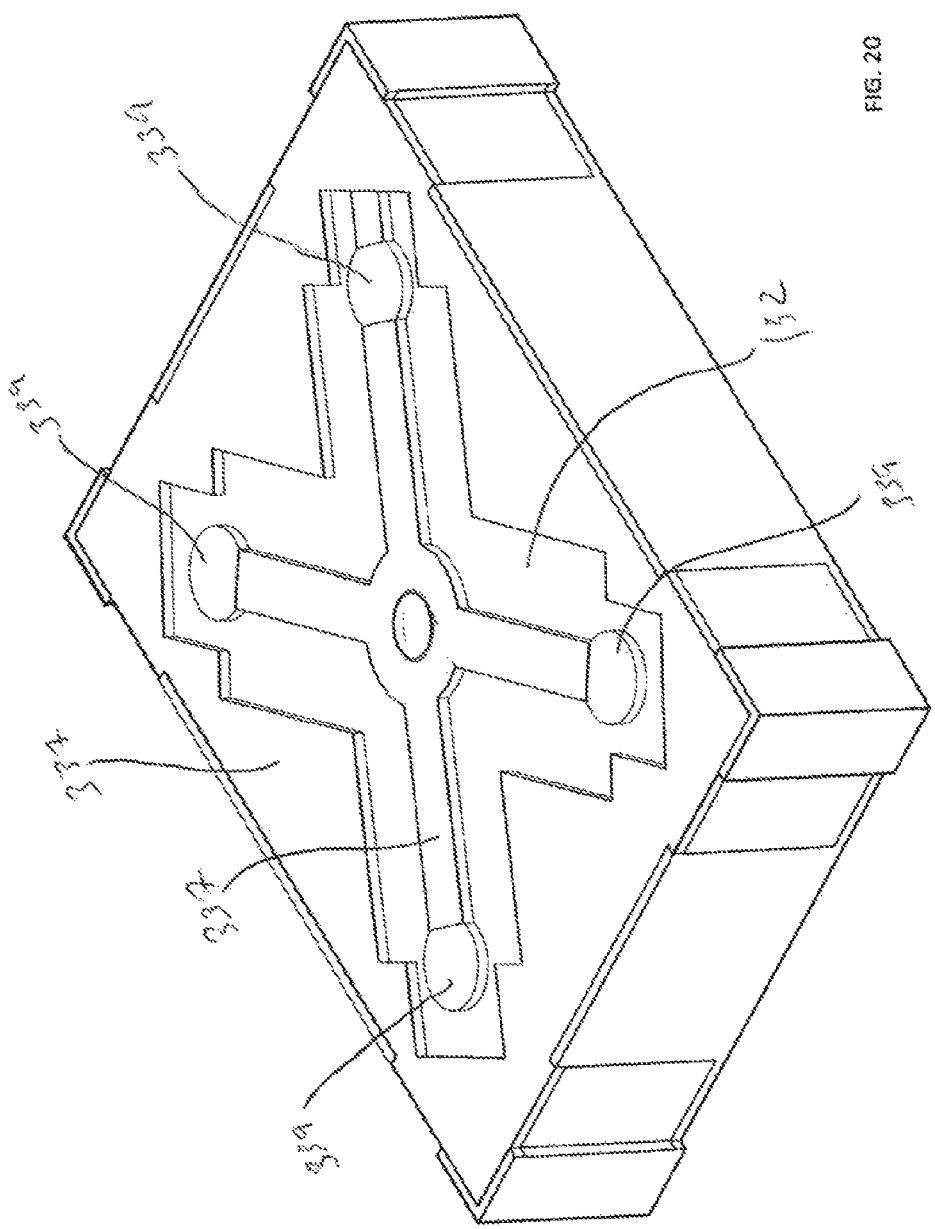
FIG. 20 is a perspective view of the) during formation in accordance with the third embodiment.
Figure 21:
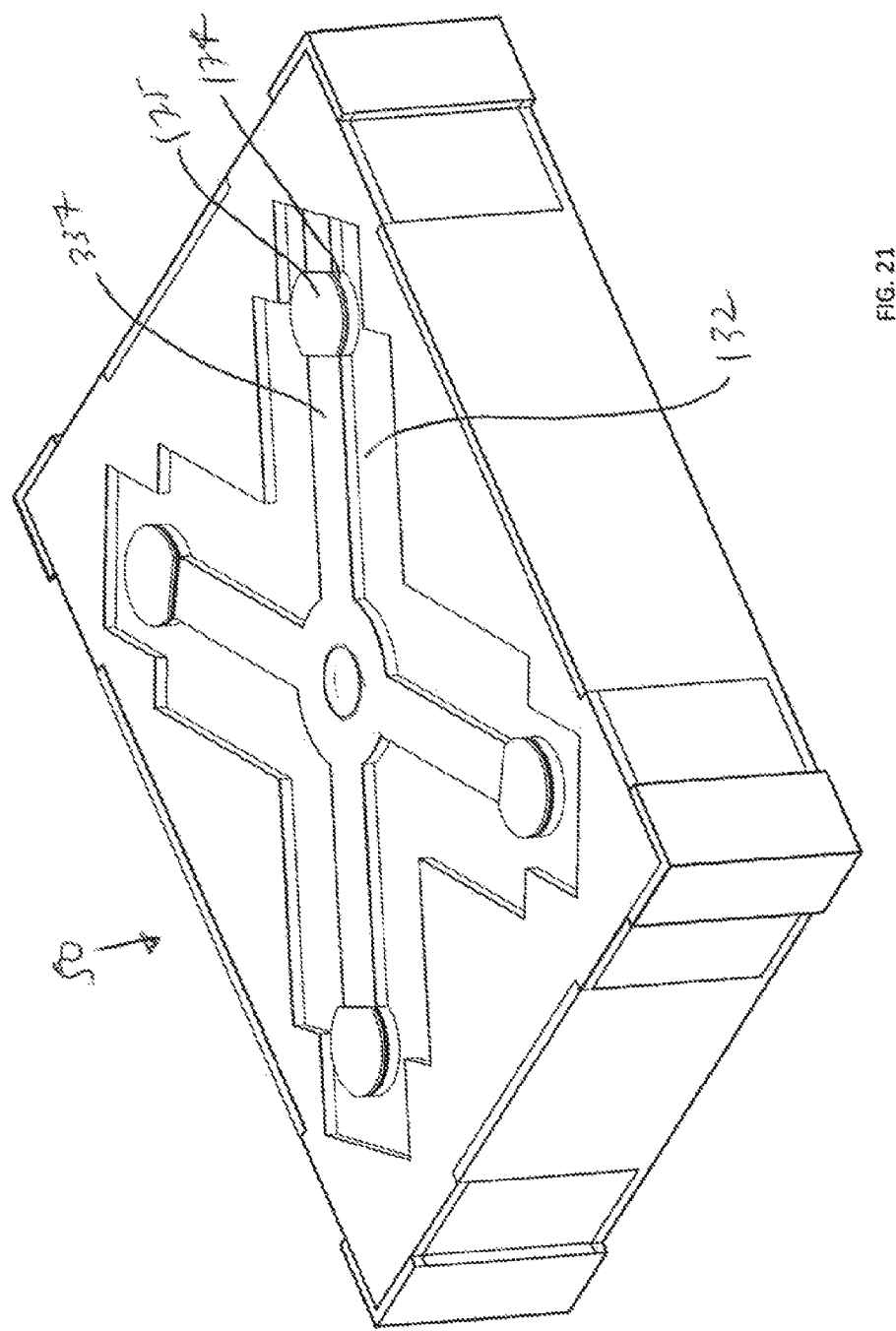
FIG. 21 is a perspective view of the MID during formation in accordance with the third embodiment.

Step 380 is a solder resist addition step where solder resist 337 is added non-selectively onto the entire assembly, including the copper plating 173 and the ablated sections 131, 132 as shown in FIG. 19. Step 380 is a solder resist removal step where a laser (not shown) ablates or removes the solder resist 337 from one or more sections 339 of the copper plating 173 overlaying the first portion 134 which will form contact point(s) for connection of the MID 50 to an associated device or assembly, such as a printed circuit board, as shown in FIG. 20. In some embodiments, the solder resist 337 on the ablated section 131, 132 and on the second portion 136 is also removed in step 380. In some embodiments, all of the solder resist 337 overlaying the ablated sections 131, 132 is removed. In some embodiments, only a portion of the solder resist 337 overlaying the ablated sections 131, 132 is removed. Alternatively, or additionally, during step 150, the solder resist 337 on the second portion 136 and the solder resist 337 that remains on the ablated sections 131, 132 that prevents the isolation of the first portion 144 is removed. Thereafter, in steps 142 and 143, the nickel plating 174 and the gold plating 175 are only electrolytic plated onto the sections 339 as shown in FIG. 21. This manufacturing process 300 reduces the amount of precious metal used and provides for limiting solder flow once the resulting MID 50 is soldered to another component.

Figure 22:
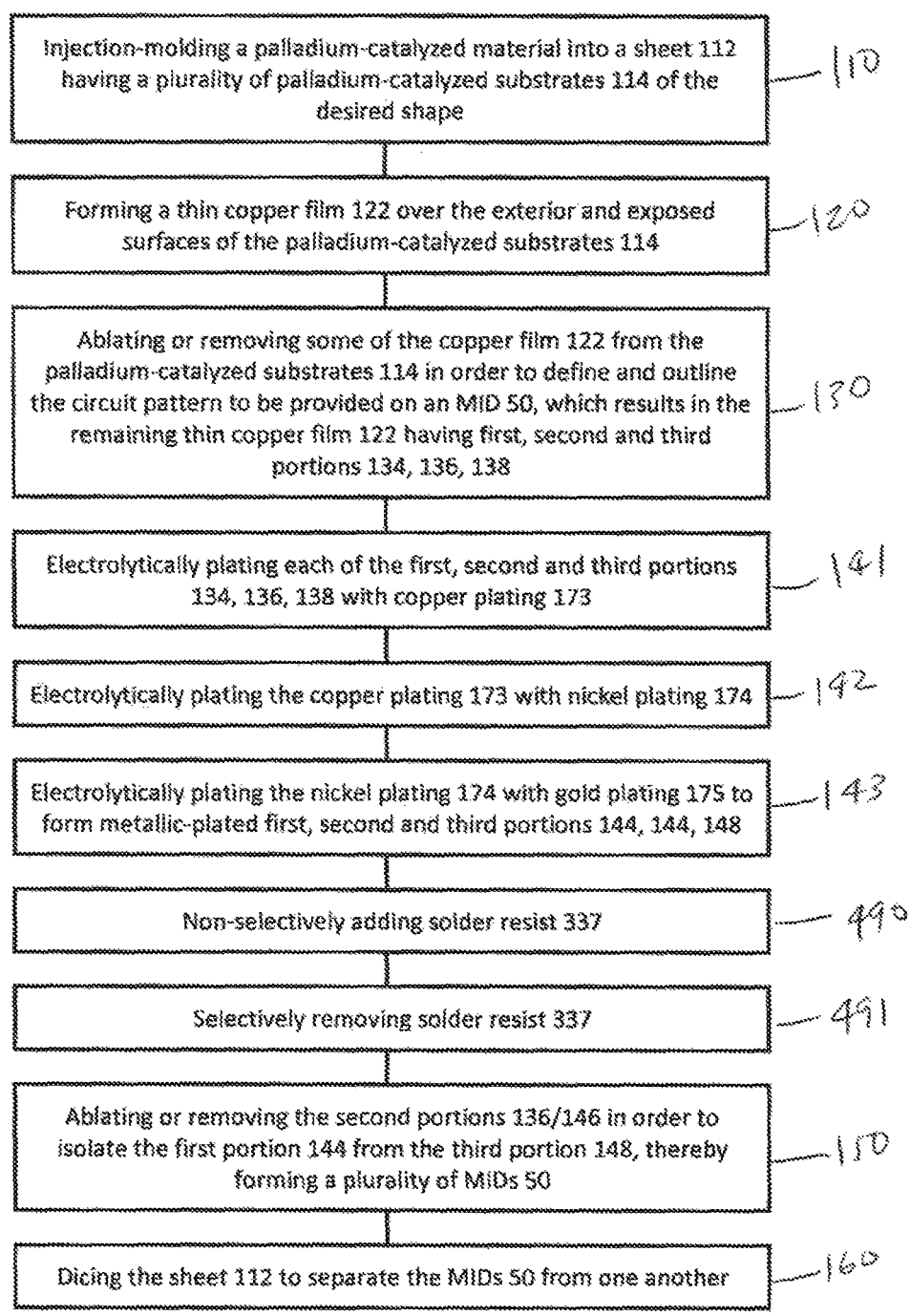
FIG. 22 is a flow chart showing the steps of a fourth embodiment of a process of manufacturing a molded interconnect device (MID)
Figure 23:
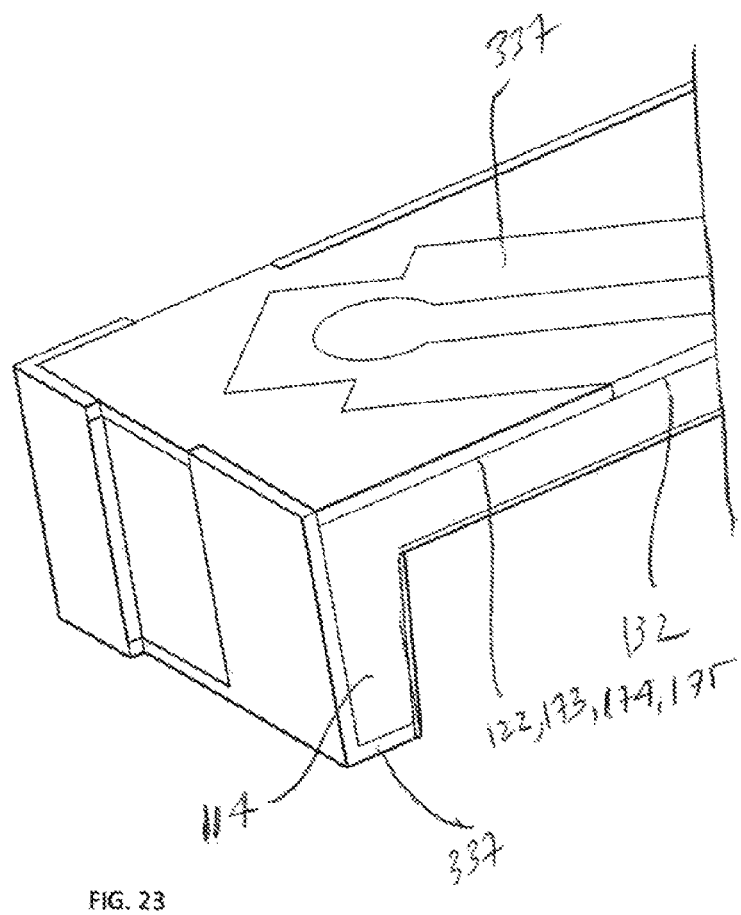
FIG. 23 is a partial perspective, cross-sectional view of the MID during formation in accordance with the fourth embodiment.
Figure 24:
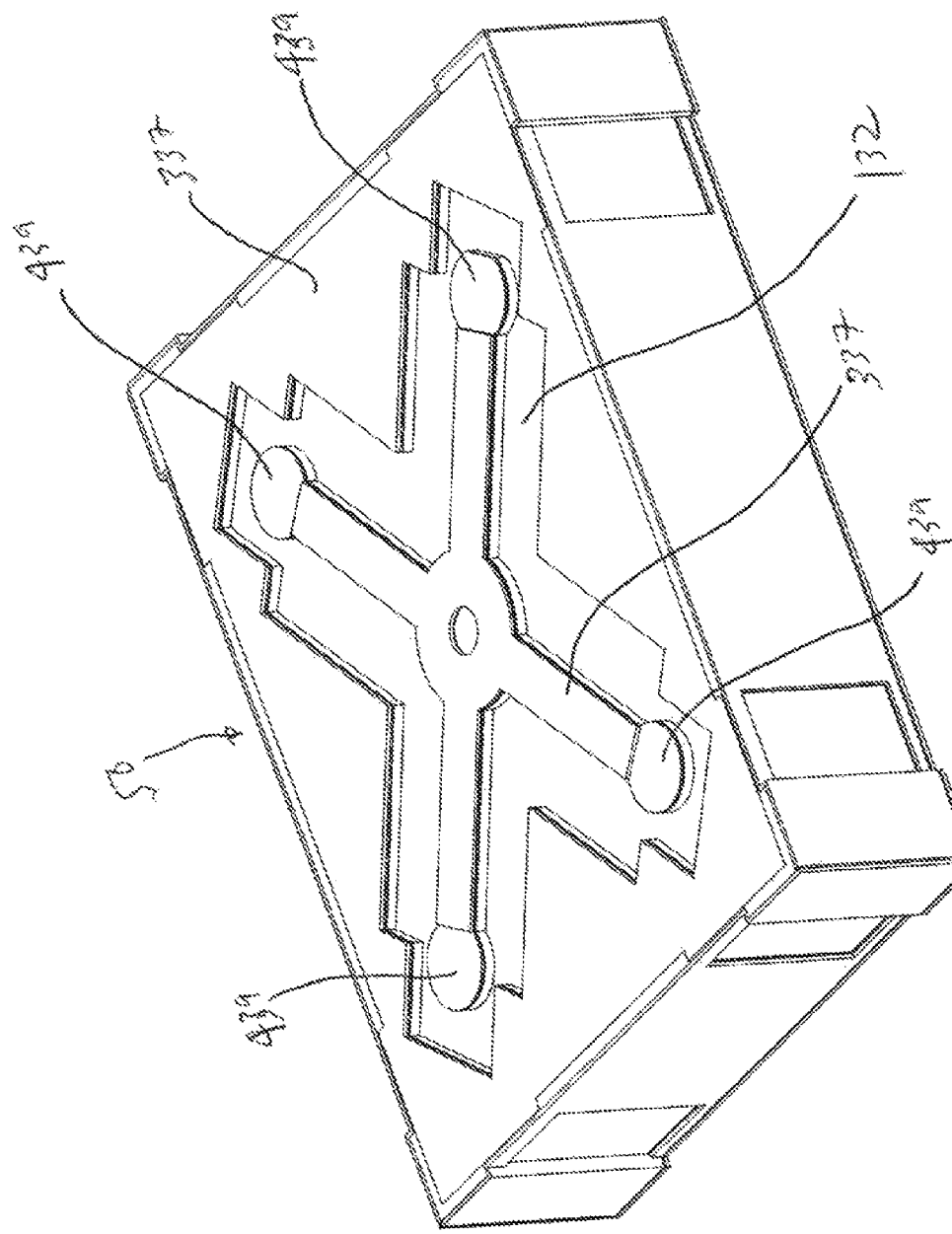
FIG. 24 is a perspective view of the MID during formation in accordance with the fourth embodiment.

Attention is directed to FIGS. 22-24 relating to a fourth embodiment of the manufacturing process 400 used to form the MID 50. FIG. 22 illustrates a flow chart depicting the steps of the manufacturing process 400. Like manufacturing process 100, manufacturing process 400 includes a molding stage, a circuit forming stage, a plating stage, and a cutting stage. Manufacturing process 300 includes each of the same steps 110, 120, 130, 141, 142, 143, 150, 160 from manufacturing process 100, also includes steps 490, 491 after step 143 and before step 150. The soft etching step 245 may be included after step 141.

Step 490 is a solder resist addition step where solder resist 337 is added non-selectively onto the entire assembly, including the gold plating 175 and the ablated sections 131, 132 as shown in FIG. 23. Step 491 is a solder resist removal step where a laser (not shown) ablates or removes the solder resist 337 from one or more sections 439 of the gold plating 175 overlaying the first portion 134 which will form contact point(s) for connection of the MID 50 to an associated device or assembly, such as a printed circuit board, as shown in FIG. 24. In some embodiments, the solder resist 337 on the ablated section 131, 132 and on the second portion 136 is also removed in step 491. In some embodiments, all of the solder resist 337 overlaying the ablated sections 131, 132 is removed. In some embodiments, only a portion of the solder resist 337 overlaying the ablated sections 131, 132 is removed. Alternatively, or additionally, during step 150, the solder resist 337 on the second portion 136 and the solder resist 337 that remains on the ablated sections 131, 132 that prevents the isolation of the first portion 144 is removed. This manufacturing process 400 provides for limiting solder flow once the resulting MID 50 is soldered to another component.

The manufacturing processes 100, 200, 300, 400 of forming the MIDs 50 are advantageous as compared to the prior-known MID manufacturing processes, especially as compared to the MIPTEC and laser developed additive technology processes. More specifically, as the injection-molded material is infused with palladium, it is then unnecessary to perform any type of surface activation treatment to the substrate 114 of the type which is required in all prior-known MID manufacturing processes. Thus, the manufacturing processes 100, 200, 300, 400 removes a step which is needed in all prior-known MID manufacturing processes, thereby saving both manufacturing costs and manufacturing time.

Figure 25:
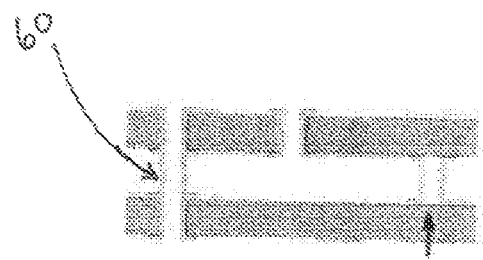
FIGS. 25-27 illustrate cross-sectional views of prior art line-of-sight features, such as through-hole type vias and overhangs or undercuts which can be plated by any of the embodiments of the process.
Figure 26:
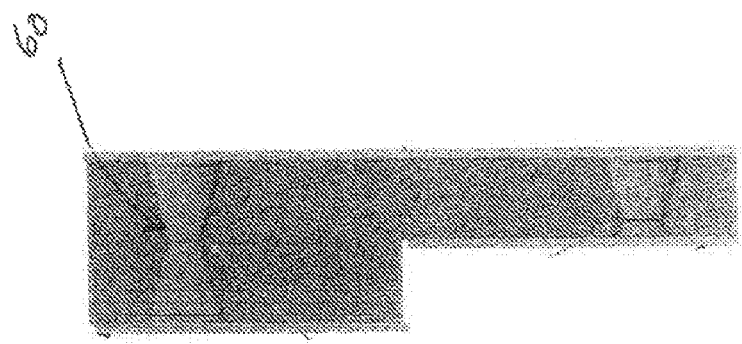
Figure 27:
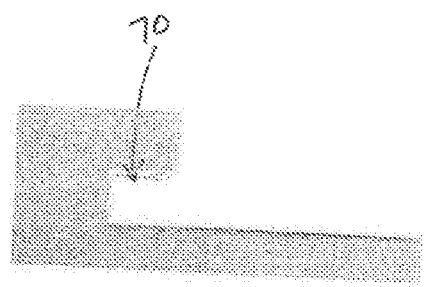

MIPTEC and LDS technology processes also have limitations, and in some circumstances even impossibilities, in connection with plating features that are not within a line-of-sight. For instance, as illustrated in FIGS. 25 and 26, a through-hole type via 60 is illustrated. Plating of the through-hole type via 60, as illustrated in FIG. 25, could not be achieved with a MIPTEC technology process because the chemical applied to the surface of the plastic would also need to be applied to the vertical walls of the via 60. Plating of the through-hole type via 60, as illustrated in FIG. 26, could not be achieved with a LDS technology process because vertical walls could not be achieved due to laser activation required angle of incidence. FIG. 27 illustrates a different line-of-sight feature 70, referred to herein as an overhang or an undercut, which likely is not possible with a MIPTEC and/or LDS technology process. The through-hole type vias 60 and overhang/undercut 70 of FIGS. 25-27, however, can be easily plated with the manufacturing processes 100, 200, 300, 400 described and illustrated herein.

Furthermore, it has been determined that the manufacturing processes 100, 200, 300, 400 provide for improved plating adhesion as compared to the prior-known MID manufacturing processes, thereby making the MIDs 50 formed from the manufacturing processes 100, 200, 300, 400 more robust and reliable than the MIDs formed from the prior-known MID manufacturing processes.

Advantageously, each of the manufacturing processes 100, 200, 300, 400 may provide an MID 50 having a Faraday cage configuration, where the third portions 148 provide the Faraday cage configuration which is useful in providing better EMI shielding for any packaged integrated circuit application. To aid in the provision of the Faraday cage configuration, each substrate 114 provided in the sheet 112 may have one or more vias (not shown) formed along saw street, namely where the sheet 112 is diced during step 160 to provide the individual MIDs 50. These vias allow for the metallization and electrolytic plating, of steps 120 and 140/140a, respectively, of all sides of the MIDs 50. It is to be understood that the size/shape of the Faraday cage configuration, if provided, may vary as desired.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All processes described herein can be performed in any suitable order unless otherwise indicated herein or otherwise clearly contradicted by context. The use of any and all examples, or exemplary language (e.g., "such as") provided herein, is intended merely to better illuminate the invention, and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A molded interconnect device (MID) comprising:
   a substrate formed of a resin which is infused with palladium;
   a circuit portion formed over first surfaces of the substrate, the first surfaces being exterior and exposed surfaces of the substrate; and
   a Faraday cage portion formed over second surfaces of the substrate, the second surfaces being exterior and exposed surfaces of the substrate,
   wherein the Faraday cage portion is isolated from the circuit portion.

2. The MID as defined in claim 1, wherein each of the circuit portion and the Faraday cage portion has a metallized layer secured to the substrate and an electrolytic metallic plated layer secured to the metallized layer.

3. The MID as defined in claim 2, wherein the metallized layer is formed of copper.

4. The MID as defined in claim 2, wherein the electrolytic metallic plated layer is formed of an electrolytic copper plated layer, and electrolytic nickel plated layer, and an electrolytic gold plated layer.

\* \* \* \* \*